United States Patent  
Ohi et al.

(10) Patent No.: US 12,211,724 B2
(45) Date of Patent: Jan. 28, 2025

(54) OPTICAL MEASUREMENT TOOL CONTAINING CHROMATIC ABERRATION ENHANCEMENT COMPONENT AND OPTICAL ALIGNMENT METHOD USING THE SAME

(71) Applicant: SANDISK TECHNOLOGIES LLC, Addison, TX (US)

(72) Inventors: Michio Ohi, Yokkaichi (JP); Maki Ueda, Yokkaichi (JP); Hiroki Mayumi, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 214 days.

(21) Appl. No.: 17/662,758

(22) Filed: May 10, 2022

(65) Prior Publication Data
US 2023/0369090 A1 Nov. 16, 2023

(51) Int. Cl.
*H01L 23/544* (2006.01)
*G02B 27/34* (2006.01)
(Continued)

(52) U.S. Cl.
CPC ............ *H01L 21/681* (2013.01); *G02B 27/34* (2013.01); *G06T 7/001* (2013.01); *G06T 7/66* (2017.01);
(Continued)

(58) Field of Classification Search
CPC ................. H01L 21/681; H01L 23/544; H01L 2223/54426; G02B 27/34; G06T 7/001;
(Continued)

(56) References Cited

U.S. PATENT DOCUMENTS 5,117,274 A * 5/1992 Mastroianni ........ H01L 21/8249
257/370
6,876,501 B2 * 4/2005 Kimura .............. G02B 27/0068
359/719
(Continued)

FOREIGN PATENT DOCUMENTS

JP 2016516307 A * 6/2016 ......... G01N 21/9501
WO WO-2009153067 A2 * 12/2009 ........... G01B 11/026

OTHER PUBLICATIONS

Chromatic and Monochromatic Optical Aberrations; Dereniak;—2008 (Year: 2008).*
(Continued)

*Primary Examiner* — Luis Perez-Fuentes
(74) *Attorney, Agent, or Firm* — THE MARBURY LAW GROUP PLLC (57) ABSTRACT

An optical alignment method includes providing an emitted radiation beam which includes a first peak wavelength and a second peak wavelength to a chromatic aberration enhancement component which increases a chromatic aberration of the emitted radiation beam, providing a first incident radiation beam having the first peak wavelength and a second incident radiation beam having the second peak wavelength which is shorter than the first peak wavelength to respective first and second alignment marks located at different vertical levels in a device under test, detecting reflected radiation from the first and second alignment marks, and using the detected reflected radiation for optical alignment of layers in the device under test.

20 Claims, 3 Drawing Sheets

(51) Int. Cl.
*G06T 7/00* (2017.01)
*G06T 7/66* (2017.01)
*G06T 7/73* (2017.01)
*H01L 21/68* (2006.01)
*H04N 23/56* (2023.01)

(52) U.S. Cl.
CPC .............. *G06T 7/74* (2017.01); *H01L 23/544* (2013.01); *H04N 23/56* (2023.01); *G06T 2207/10152* (2013.01); *G06T 2207/30148* (2013.01); *G06T 2207/30204* (2013.01); *H01L 2223/54426* (2013.01)

(58) Field of Classification Search
CPC ... G06T 7/66; G06T 7/74; G06T 2207/10152; G06T 2207/30148; G06T 2207/30204; H04N 23/56
USPC .......................................................... 348/95
See application file for complete search history.

(56) References Cited

U.S. PATENT DOCUMENTS

| | | | |
|---|---|---|---|
| 9,985,046 B2 | 5/2018 | Lu et al. | |
| 10,853,959 B2 | 12/2020 | Yoshitake et al. | |
| 11,018,063 B2 | 5/2021 | Sawai | |
| 11,726,046 B2* | 8/2023 | Jung | H01L 22/20 356/237.2 |
| 2001/0007498 A1* | 7/2001 | Arai | H01L 21/67282 356/401 |
| 2001/0055414 A1 | 12/2001 | Thieme | |
| 2003/0081299 A1* | 5/2003 | Suzuki | G02B 26/127 359/216.1 |
| 2007/0035850 A1 | 2/2007 | Danner et al. | |
| 2007/0284527 A1 | 12/2007 | Zani et al. | |
| 2013/0242262 A1 | 9/2013 | Lewis | |
| 2016/0064296 A1* | 3/2016 | Suzumura | H01L 22/34 438/4 |
| 2017/0069291 A1 | 3/2017 | Holub | |
| 2017/0358594 A1 | 12/2017 | Lu et al. | |
| 2018/0286036 A1* | 10/2018 | Iwata | G01N 21/8806 |
| 2018/0299253 A1 | 10/2018 | Liu et al. | |
| 2019/0011376 A1* | 1/2019 | Seitz | G03F 7/70575 |

OTHER PUBLICATIONS

Beam alignment and related problems of spherical aberration; Hu—2000. (Year: 2000).*

* cited by examiner

OPTICAL MEASUREMENT TOOL CONTAINING CHROMATIC ABERRATION ENHANCEMENT COMPONENT AND OPTICAL ALIGNMENT METHOD USING THE SAME

FIELD

The present disclosure relates generally to the field of semiconductor device manufacturing metrology tools, and particularly to a dual focus optical measurement tool containing a chromatic aberration enhancement component and optical alignment using the same.

BACKGROUND

Overlay measurements in semiconductor device manufacturing metrology employs optical detection (e.g., image capture) of geometric features (e.g., underlying alignment marks) formed employing different lithographic exposure processes to determine lateral offset distances of subsequently formed geometric features (e.g., overlying alignment marks) relative to previously formed geometric features.

SUMMARY

According to an aspect of the present disclosure, an optical alignment method includes providing an emitted radiation beam which includes a first peak wavelength and a second peak wavelength to a chromatic aberration enhancement component which increases a chromatic aberration of the emitted radiation beam, providing a first incident radiation beam having the first peak wavelength and a second incident radiation beam having the second peak wavelength which is shorter than the first peak wavelength to respective first and second alignment marks located at different vertical levels in a device under test, detecting reflected radiation from the first and second alignment marks, and using the detected reflected radiation for optical alignment of layers in the device under test.

According to another aspect of the present disclosure, an optical measurement apparatus comprises a radiation source configured to emit radiation at two or more peak wavelengths that include a first peak wavelength and a second peak wavelength, a source-side optics system configured to guide an emitted radiation beam from the radiation source along an incident radiation path, a support configured to support a device under test, a chromatic aberration enhancement component located between the source-side optics system and the support and configured to increase a chromatic aberration of the emitted radiation beam and to provide a first incident radiation beam having the first peak wavelength and a second incident radiation beam having the second peak wavelength which is shorter than the first peak wavelength toward the support, and an optical detector.

DETAILED DESCRIPTION

In some semiconductor manufacturing processes, subsequently formed geometric features (e.g., overlying alignment marks) patterned by lithographic exposure and development are vertically offset by a significant distance relative to previously formed geometric features (e.g., underlying alignment marks) relative to the wavelength of the light employed to capture the geometric features. For example, a three-dimensional memory device employing an alternating stack of insulating layers and electrically conductive layers may have a thickness of at least one micron. Such three-dimensional memory device may be formed by forming a lower stack of insulating layers and sacrificial layers in a first deposition step, followed by forming an upper stack of insulating layers and sacrificial layers over the lower stack in a separate deposition step. The sacrificial layers (e.g., silicon nitride layers) may be subsequently replaced with the electrically conductive layers (e.g., word lines and select gate electrodes). In such cases, capture of an image of previously formed geometric features (e.g., underlying alignment marks in the lower stack) and capture of an image of subsequently formed geometric features (e.g., overlying alignment marks in the upper stack) require focusing of a monochromatic light at two different focal depths (e.g., a double capture process in which underlying alignment marks are detected using longer wavelength light than overlying alignment marks). Thus, the optical system of a measurement tool is switched between the two image capture operations at different wavelengths, and an overlay measurement for a subsequently formed lithographically patterned image relative to a previously formed lithographically patterned image takes significant time due to the second capture process.

The embodiments of the present disclosure are directed to a multi-focus (e.g., dual focus) optical measurement tool containing a chromatic aberration enhancement component and methods for operating the same, the various aspects of which are now described in detail. The chromatic aberration component allows two different wavelengths of radiation with two different depths of focus to be provided on the device under test at the same time and to optically detect both the overlying and underlying alignment marks at the same time in a single capture process. The single capture process takes less time than the double capture process, which improves the process throughput.

In semiconductor structures including many layers, such as three-dimensional NAND memory devices, the thickness of the device can be significant and overlay error measurement becomes difficult due to a large height difference between an underlying alignment mark (e.g., an overlying overlay mark) and an overlying alignment mark (e.g., underlying overlay mark). For example, a total thickness of an alternating stack including insulating layers and sacrificial layers may be greater than 1 micron, and may be 1.5 to 100 microns. In such cases, an overlay measurement tool focuses on an underlying overlay mark located underneath the alternating stack by making first optical adjustments to be able to generate a focused image of the underlying overlay mark, and then focuses on an overlying overlay mark located above the alternating stack by making second optical adjustments to be able to generate a focused image of the overlying overlay mark. The optical adjustments in the optical system of the overlay measurement tool requires significant time, and can significantly decrease the throughput of the overlay measurement tool.

The apparatus and the methods of the embodiments of the present disclosure provide a simultaneous optical detection (e.g., image generation) of the underlying overlay mark and the overlying overlay mark employing a chromatic aberration magnification optical system to simultaneously generate a first image of the underlying overlay mark and a second image of the overlying overlay mark using different wavelength of light with different depth of focus, and to significantly increase the throughput of an overlay measurement operation.

Figure 1:
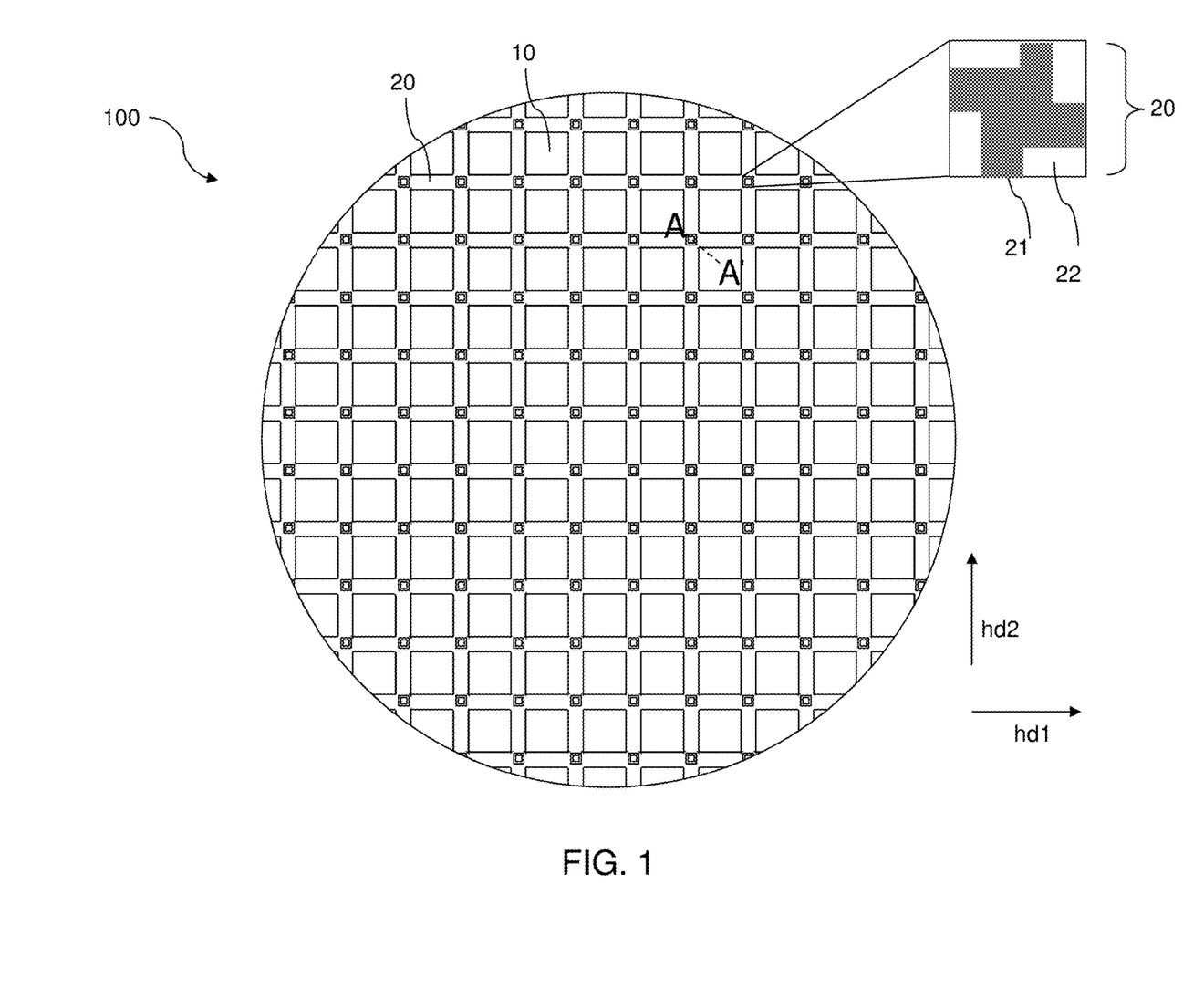
FIG. 1 is a schematic top-down view of a semiconductor device wafer including first alignment marks and second alignment marks according to an embodiment of the present disclosure.

Referring to FIG. 1, a device under test, such as a semiconductor device wafer 100 is illustrated, which can be employed for overlay measurements employing the apparatus and the methods of the embodiments of the present disclosure. The semiconductor device wafer 100 may be provided by forming a two-dimensional array of semiconductor device dies 10 on a commercially available substrate, such as a silicon wafer, for example a silicon wafer having a diameter of 100 mm, 150 mm, 200 mm, 300 mm, or 450 mm. In one embodiment, the two-dimensional array of semiconductor device dies 10 may be arranged as a periodic rectangular array having a first periodicity along a first horizontal direction hd1 and having a second periodicity along a second horizontal direction hd2. The two-dimensional array of semiconductor device dies 10 can be formed by depositing and patterning various material layers over the substrate. In one embodiment, the semiconductor device dies 10 may comprise in-process three-dimensional NAND memory devices. However, other devices may also be used.

Various alignment marks can be formed during patterning of the various material layers in kerf regions 20, which are regions between neighboring pairs of semiconductor device dies 10. Previously formed alignment marks can be employed in subsequently lithographic patterning steps to align a new lithographic pattern in a photoresist layer, and to measure the overlay error of the new lithographic pattern relative to pre-existing patterns located at various underlying levels of semiconductor devices formed over the substrate.

In one embodiment, the various alignment marks can include first alignment marks (e.g., underlying overlay marks) 21 formed at a first level and second alignment marks (e.g., overlaying alignment marks) 22 formed at a second level located above the first level. Generally, the alignment marks can be formed at each lithographic level, and the semiconductor device wafer 100 including semiconductor devices may include multiple levels of alignment marks. As such, additional alignment marks may be formed at additional lithographic levels although such additional alignment marks are not shown in the drawings for clarity.

Figure 2:
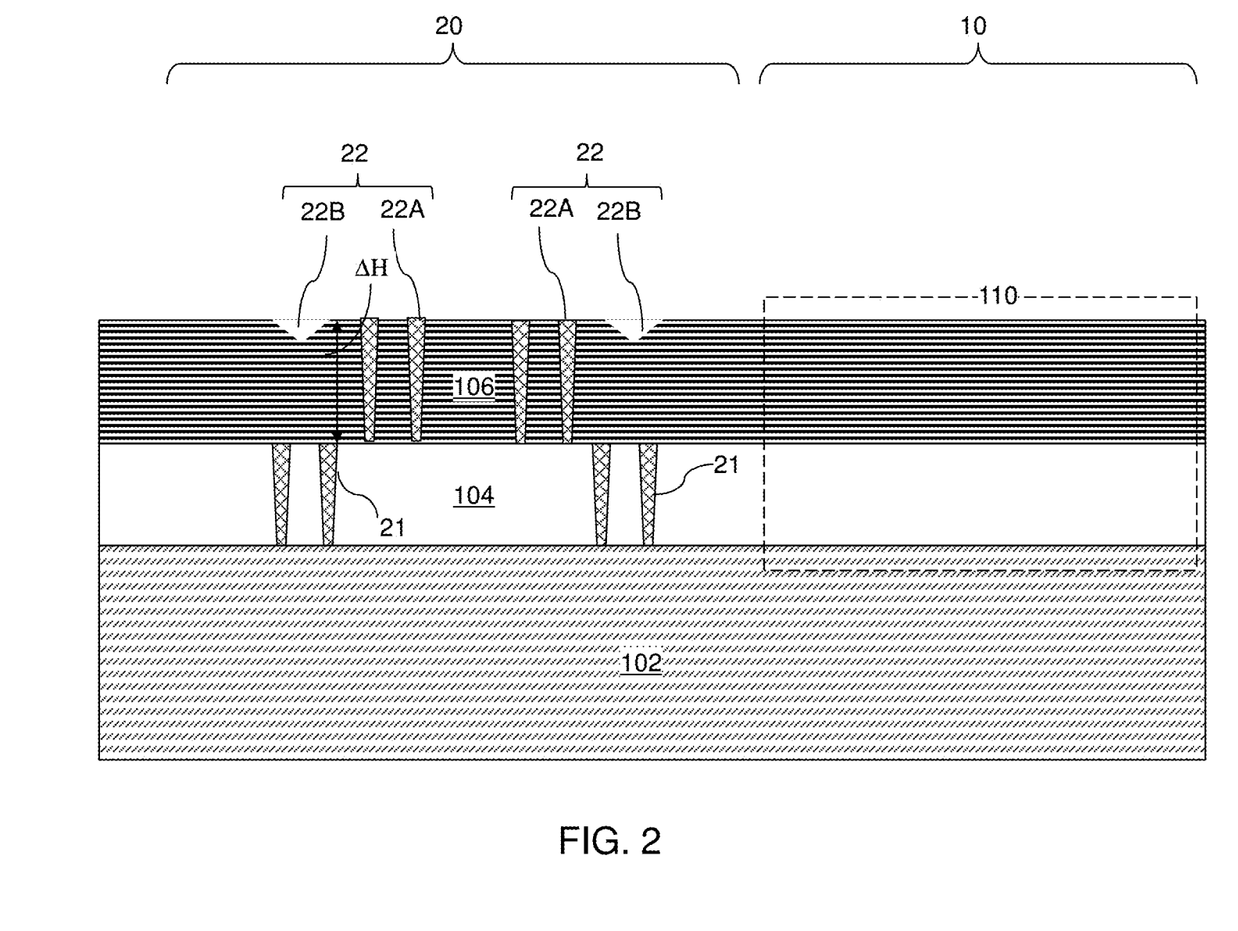
FIG. 2 is a schematic vertical cross-sectional view of a region along plane A-A' of the semiconductor device wafer of FIG. 1 according to an embodiment of the present disclosure.

Referring to FIG. 2, a schematic vertical cross-sectional view of a region of the semiconductor device wafer 100 along plane A-A' of FIG. 1 is illustrated. An edge portion of a semiconductor device die 10 and a kerf region 20 is illustrated. The semiconductor device wafer 100 may comprise a substrate 102, which may be any commercially available silicon wafer. First material layers 104 may be formed over the substrate 102. Various components of semiconductor devices 110 may be formed within the first material layers 104 within the area of each semiconductor device die 10, and first alignment marks 21 may be formed in the first material layers 104 within the kerf regions 20. The level of the first material layers 104 is herein referred to as a first level, i.e., a first volume having a first thickness range as measured from the top surface of the substrate 102 to the top of the first material layers 104.

Second material layers 106 may be formed over the first material layers 104. Various additional components of the semiconductor devices 110 may be formed within the second material layers 106 within the area of each semiconductor device die 10, and second alignment marks 22 may be formed in the second material layers 106 within the kerf regions 20. The level of the second material layers 106 is herein referred to as a second level, i.e., a second volume having a second thickness range as measured from the top surface of the substrate 102. The second thickness range may be from top of the first material layers 104 to the top of the second material layers 106.

In an illustrative example, the second material layers 106 may include an alternating stack of insulating layers (e.g., silicon oxide layers) and sacrificial layers (e.g., silicon nitride layers). Each layer within the alternating stack may have a thickness in a range from 25 nm to 60 nm, and the total number of repetitions of a unit layer stack including an insulating layer and an electrically conductive layer may be in a range from 16 to 1,024, such as from 32 to 512. The height difference $\Delta H$ between the top surface of the second alignment marks 22 and the top surface of the first alignment marks 21 can be the same as, or about, the total thickness of the second material layers 104. For example, the $\Delta H$ between the top surface of the second alignment marks 22 and the top surface of the first alignment marks 21 may be in a range from 1 micron to 1000 microns, such as from 1 micron to 10 microns.

Generally, overlay measurement between two lithographically defined patterns is based on imaging of two overlay marks located at two different levels. The overlay marks may be provided in any configuration that allows measurement of shift of one pattern relative to another pattern. In an illustrative example, a first align mark 21 may be formed in first material layers 104 and a second alignment mark 22 may be formed in second material layers 106. The overlay error is calculated as the lateral distance between the center position of the first alignment mark in an image and the center position of the second alignment mark in the same image or in a different image. In case the center positions of the two alignment marks are calculated from a single image, the overlay error measurement method is referred to as a single grab (SG) overlay measurement method. In case the center position of the two alignment marks are calculated from two different images that are focused on the first alignment mark or the second alignment mark, respectively, the overlay error measurement method is referred to as a dual grab (DG) overlay measurement method.

Typically, the dual grab overlay error measurement method takes about twice as much time as the single grab overlay error measurement method. There is a contrast difference between a first image that focuses on the first alignment mark 21 and a second images that focuses on the second alignment mark 22 due to the differences in the mark structures. For example, the second alignment mark 22 may include an inner second alignment mark 22A and an outer second alignment mark 22B. The inner second alignment mark 22A may have the same structure as the first alignment mark 21 (e.g., one or more pillars which extend through the surrounding layers) and may be located above and laterally inward of the first alignment mark 21. The outer second alignment mark 22B may have a different structure from first alignment mark 21 and may be located directly above the first alignment mark 21. For example, the outer second alignment mark 22B may comprise a step or a recess in the top of the second material layers 106.

When the height difference ΔH is greater than a certain level, such as 1 micron or more, the first overlay mark 21 and the second overlay mark 22 cannot be in focus simultaneously using a single radiation wavelength. Combined with the effects of the contrast difference, two separate images of the first alignment mark and the second alignment mark are needed in order to provide an accurate measurement of the overlay error between a first lithographic pattern that generates the first alignment mark 21 and a second lithographic pattern that generates the second alignment mark 22.

In order to properly focus on the first alignment mark 21, a collimated monochromatic incident radiation (e.g., visible light) having a first peak wavelength passes through an optical system including at least one lens such that the incident radiation has a focal point within a horizontal plane including the first alignment mark 21. Correspondingly, in order to properly focus on the second alignment mark 22, a collimated monochromatic incident radiation (e.g., visible light) having a second peak wavelength longer than the first peak wavelength passes through an optical system including at least one lens such that the incident radiation has a focal point within a horizontal plane including the second alignment mark 22. Since a change in the optics system is used change the wavelength and the resulting focal point of the incident radiation between two image grab operations for imaging the first alignment mark 21 and the second alignment mark 22, the dual grab overlay error measurement operation may be more than twice as long as the single grab overlay error measurement operation in some cases.

Figure 3:
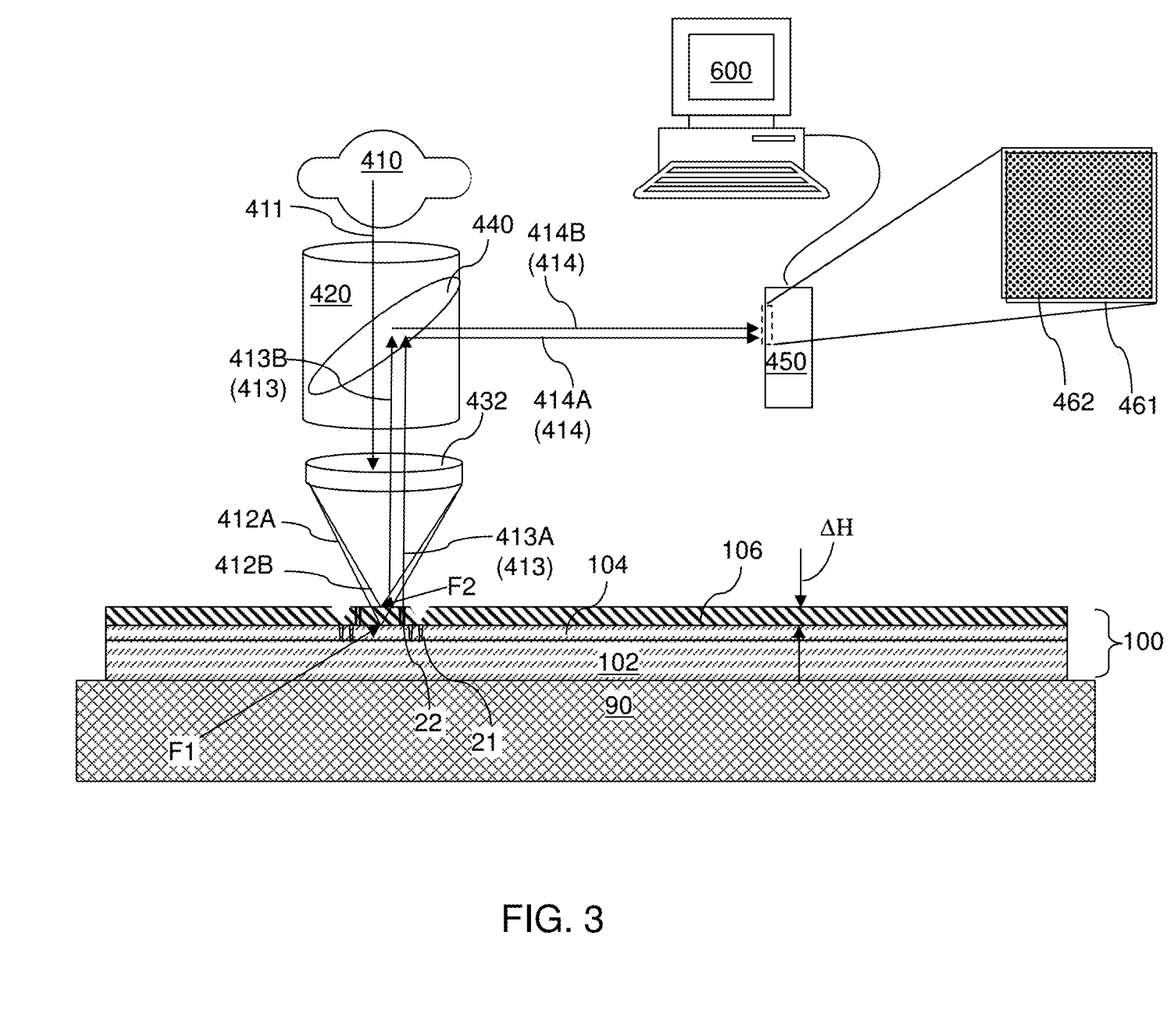
FIG. 3 is a schematic view of an exemplary optical measurement apparatus according to an embodiment of the present disclosure.

Referring to FIG. 3 and according to an embodiment of the present disclosure, an exemplary optical measurement apparatus according to an embodiment of the present disclosure is illustrated. The exemplary optical measurement apparatus permits simultaneous generation of a first focused image that captures a first alignment mark 21 and a second focused image that captures a second alignment mark 22 by adding a chromatic aberration enhancement component.

The exemplary optical measurement apparatus of the present disclosure comprises a radiation source 410 configured to emit radiation (e.g., visible light, infrared radiation and/or ultraviolet radiation) containing two or more peak wavelengths that include a first peak wavelength and a second peak wavelength different from the first peak wavelength. The radiation source 410 may comprise a lamp configured to emit polychromatic radiation e.g., visible light, infrared radiation and/or ultraviolet radiation containing two or more peak wavelengths. The apparatus may also contain a source-side optics system 420 configured to guide an emitted radiation beam (e.g., visible light, IR or UV radiation beam) 411 from the radiation source 410 along an incident radiation path. The source-side optics system 420 may comprise one or more lenses and/or mirrors.

The apparatus also includes at least one chromatic aberration enhancement component ("CAE component") 432. The CAE component 432 may comprise any optical component which increases (i.e., magnifies) the chromatic aberration of the emitted radiation beam 411. For example, the CAE component 432 may comprise at least one lens, a prism or a material which enhances the spatial separation of the peak wavelengths of the polychromatic emitted radiation beam 411. In one embodiment, the CAE component 432 may comprise at least one lens, a prism or a material which enhances the axial chromatic aberration of the polychromatic emitted radiation beam 411. Thus, the CAE component 432 converts a first component of the emitted radiation beam 411 having the first peak wavelength to a first incident radiation beam 412A focused at a first focal point F1 located at a first focal distance (i.e., the vertical distance between a chromatic aberration enhancement component 432 in the incident radiation path and a first alignment mark 21). The CAE component 432 also converts second component of the emitted radiation beam 411 having the second peak wavelength to a second incident radiation beam 412B focused at a second focal point F2 located at a second focal distance different from the first distance (i.e., the vertical distance between the chromatic aberration enhancement component 432 in the incident radiation path and a second alignment mark 22).

The apparatus may also contain a support (e.g., wafer chuck) 90 configured to hold a device under test (such as a semiconductor device wafer 100) such that the first focal point F1 and the second focal point F2 are located within a volume of the wafer. The chromatic aberration enhancement component 132 is located between the source-side optics system 420 and the support 90, and is configured to increase a chromatic aberration of the emitted radiation beam 411 and to provide a first incident radiation beam 412A having the first peak wavelength and a second incident radiation beam 412B having the second peak wavelength which is shorter than the first peak wavelength toward the support (i.e., onto the device under test).

Generally, the first incident radiation beam 412A includes a first peak wavelength and the second incident radiation beam 412B includes a second peak wavelength which is shorter than the first peak wavelength. In one embodiment, the first peak wavelength and the second peak wavelength may be in the visible radiation range (i.e., between 400 nm and 700 nm). For example, the first peak wavelength may be in the red visible light range (e.g., 610 to 700 nm), while the second peak wavelength may be in the blue or violet visible light range (e.g., 400 to 430 nm).

The apparatus may also contain a sensor-side optics system 440 configured to direct reflected radiation beam(s) 413 that is generated by reflection of the first and second incident radiation beams 412A, 412B from the device under test 100, and an optical detector 450. The sensor-side optics system 440 may comprise a partial mirror and/or other beam guiding components. The optical detector may comprise an optical image sensor 450 that generates a first image from a first component of the reflected radiation beam 413 that has the first peak wavelength, and to generate a second image from a second component of the reflected radiation beam 413 that has the second peak wavelength.

Chromatic aberration, also referred to as chromatic distortion and spherochromatism, is a failure of a lens to focus spectra having different wavelengths to a same focal point. Generally, high chromatic aberration is considered undesirable in an optics system. In the optical measurement apparatus of the embodiments of the present disclosure, however, chromatic aberration is advantageously employed to provide two different focal points for the two overlapping incident radiation beams 412A and 412B having different peak wavelengths. For example, the first focal point F1 of the first incident radiation beam may be up to about 1.5 mm deeper, such as up to 1.2 to 1.5 mm deeper, in the semiconductor device wafer 100 than the second focal point F2.

Chromatic aberration is expressed as a following formula: $\delta f = -f/v$, in which of $\delta f$ is the chromatic aberration, f is the depth of focus, and v is Abbe's number. Abbe's number is a reciprocal of dispersive power. Chromatic aberration is large when Abbe's number is small. In one embodiment, large chromatic aberration can be provided by forming the chromatic aberration enhancement component 432 as a composite lens including multiple component lenses and/or multiple materials. The difference in focus depth between the first focal point F1 and the second focal point F2 may be varied by varying the distance (i.e., depth) between the lenses of the chromatic aberration enhancement component 432. As noted above, the first focal point F1 of the first incident radiation beam may be up to 1.2 to 1.5 mm deeper in the semiconductor device wafer 100 than the second focal point F2. The distance between the lenses may be adjusted to provide a smaller difference in depths of the focal points. Therefore, since different levels in the semiconductor device wafer 100 are separated by only 1 to 5 microns, the chromatic aberration enhancement component 432 can easily provide different focal point depths in the semiconductor device wafer that are vertically separated by only 1 to 5 microns because it is orders of magnitude less than the maximum difference in the focal point depths that may be provided by the CAE component 432.

The chromatic aberration enhancement component 432 includes a material having high chromatic dispersion. In this case, the chromatic aberration enhancement component 432 can provide high chromatic aberration between the first peak wavelength and the second peak wavelength. Generally, the material of the chromatic aberration enhancement component 432 may be selected among optically transparent materials having high chromatic dispersion, which tend to be materials having a nominally high index of refraction. In one embodiment, the chromatic aberration enhancement component may include glass having an index of refraction in a range from 1.8 to 2.0 at 656.3 nm wavelength, which is one of the Balmer series hydrogen emission wavelengths within a red spectral range.

According to an aspect of the present disclosure, the difference in the first focal depth and the second focal depth may be at least 1 micron. In one embodiment, the difference in the first focal depth and the second focal depth may be in a range from 1 to 10 microns, such as from 1 micron to 5 microns, although a greater difference may also be employed.

The reflected radiation beam 413 includes a first component having the first peak wavelength, which is herein referred to as a first-wavelength component 413A of the reflected radiation beam 413. The reflected radiation beam 413 further includes a second component having the second peak wavelength, which is herein referred to as a second-wavelength component 413B of the reflected radiation beam 413. Upon redirection by the sensor-side optics system 440, the reflected radiation beam 413 becomes a redirected reflected radiation beam 414. The redirected reflected radiation beam 414 includes a first component having the first peak wavelength, which is herein referred to as a first-wavelength component 414A of the redirected reflected radiation beam 414. The redirected reflected radiation beam 414 further includes a second component having the second peak wavelength, which is herein referred to as a second-wavelength component 414B of the redirected reflected radiation beam 414.

In one embodiment, the optical image sensor 450 can be configured to simultaneously generate the first image and the second image. In one embodiment, the optical image sensor 450 may comprise a first array of photosensitive pixels 461 containing first optical filters configured to pass radiation with the first peak wavelength and to block radiation with the second peak wavelength, and a second array of photosensitive pixels 462 containing second optical filters configured to pass radiation with the second peak wavelength and to block radiation with the first peak wavelength. Thus, the first array of photosensitive pixels 461 may be configured to generate a first image of the first alignment (e.g., overlay) mark 21 by capturing the first-wavelength component 414A of the redirected reflected radiation beam 414. The second array of photosensitive pixels 462 may be configured to generate a second image of the second alignment (e.g., overlay) mark 22 by capturing the second-wavelength component 414B of the redirected reflected radiation beam 414.

In one embodiment, the optical measurement apparatus of the embodiments of the present disclosure may comprise an controller 600, such as a computer or logic circuit loaded with an image analysis program. The image analysis program may be configured to automatically determine a location of a geometrical center of first geometrical features (that represent the first alignment mark 21) in focus that are captured in the first image, and to automatically determine a geometrical center of second geometrical features (that represent the second alignment mark 22) in focus that are captured in the second image. In one embodiment, the processor 600 may be configured to automatically calculate the overlay offset between the first alignment mark 21 and the second alignment mark 22. In one embodiment, the processor 600 contains an overlay offset calculation program that calculates a lateral physical distance between a first physical location in the semiconductor device wafer 100 that corresponds to the geometrical center of the first geometrical features 21 (which is the location of the first alignment mark 21) in the first image, and a second physical location in the semiconductor device wafer 100 that corresponds to the geometrical center of the second geometrical features 22 (which is the location of the second alignment mark 22) in the second image.

In one embodiment, the image analysis program may be configured to provide digital filtering on the first image and/or on the second image before determination of locations of the first alignment mark 21 and/or the second alignment mark 22. In one embodiment, the image analysis program may be configured to discard defocused image components generated from the second geometrical features 22 (i.e., an image component from the second alignment mark 22) from the first image prior to determining the location of the geometrical center of the first geometrical features (which is an image of the first alignment mark 21) in the first image. In one embodiment, the image analysis program may be configured to discard defocused image components generated from the first geometrical features 21 (i.e., an image component from the first alignment mark 21) from the second image prior to determining the location of the geometrical center of the second geometrical features 22 (which is an image of the second alignment mark 22) in the second image. The discarding of the defocused image components may be effected, for example, by running an image correction program.

The second peak wavelength may differ from the first peak wavelength at least by 10%. In one embodiment, the ratio of the second peak wavelength to the first peak wavelength is in a range from 0.5 to 0.9.

In one embodiment, the radiation source 410 comprises an arc lamp configured to emit radiation generated by an electrical discharge in gas. The arc lamp may include hydrogen, neon, argon, or any other suitable gas as a medium for providing radiation emission through electrical discharge. In an illustrative example, the radiation source 410 comprises a hydrogen arc lamp. In one embodiment, the first peak wavelength and the second peak wavelength are wavelengths within Balmer series spectral wavelengths. For example, the first wavelength may be a first emission spectral wavelength within the Balmer series spectral wavelengths (such as 656.3 nm), and the second wavelength may be a second emission spectral wavelength within the Balmer series spectral wavelengths (such as 486.1 nm).

In one embodiment, the first focal point F1 and the second focal point F2 may be vertically offset by a vertical distance (i.e., a focal distance offset) in a range from 1 micron to 100 microns, such as from 1 micron to 5 microns.

In one embodiment, the support (e.g., wafer chuck) 90 may be configured to hold a semiconductor device wafer having a circular horizontal cross-sectional shape and having a diameter in a range from 100 mm to 450 mm. In one embodiment, the optical measurement apparatus may be provided with a direct-monitor camera (not shown) configured to capture a video image of the area of the semiconductor device wafer 100 around the incident radiation beams (412A, 412B), and with a chuck movement mechanism to position an area of interest (such as an area in which a first overlay mark 21 and a second overlay mark 22 are present) at the location of the incident radiation beams. In one embodiment, the controller 600 may be configured to control movement of the wafer chuck 90. Alternatively or in addition, the controller 600 may be configured to control the movement of the emitted radiation beam 411 relative to the semiconductor device wafer 100 by controlling the source-side optics system 420 (e.g., by moving one or more lenses and/or mirrors). Thus, one or both of the support 90 and/or the emitted radiation beam 411 may be moved to laterally translate the incident radiation beams 412A and 412B relative to the semiconductor device wafer 100.

In one embodiment, the controller 600 may be loaded with a pattern recognition program that is configured to analyze preliminary images of patterns on the semiconductor device wafer, 100 to identify locations of a predefined target pattern, and to laterally move the semiconductor device wafer to a position at which the predefined target pattern is placed at a center of a field of view within images captured by the optical image sensor 450. In one embodiment, the controller 600 may be loaded with an automatic focus program that is configured to vertically move the semiconductor device wafer until first geometrical features of the semiconductor device wafer located at the first focal point F1 and second geometrical features of the semiconductor device wafer located at the second focal point F2 are simultaneously focused.

According to an aspect of the present disclosure, an optical alignment method includes providing an emitted radiation beam 411 which includes a first peak wavelength and a second peak wavelength to a chromatic aberration enhancement component 432 which increases a chromatic aberration of the emitted radiation beam 411, providing a first incident radiation beam 412A having the first peak wavelength and a second incident radiation beam 412B having the second peak wavelength which is shorter than the first peak wavelength to respective first and second alignment marks (21, 22) located at different vertical levels in a device under test 100, detecting reflected radiation 414 from the first and second alignment marks and using the detected reflected radiation for optical alignment of layers in the device under test 100.

In one embodiment, the chromatic aberration enhancement component 432 converts a first component of the emitted radiation beam having the first peak wavelength to the first incident radiation beam 412A focused at a first focal point F1 located at a first focal distance in the device under test 100, and converts a second component of the emitted radiation beam having the second peak wavelength to the second incident radiation beam 412B focused at a second focal point F2 located at second focal distance different from the first focal distance in the device under test 100. The first and second incident radiation beams are provided simultaneously from the chromatic aberration enhancement component 432 to the device under test 100.

In one embodiment, the device under test 100 comprises semiconductor device wafer including the first alignment mark 21 located at a first level and the second alignment mark 22 located at a second level that are vertically offset by a spacing in a range from 80% to 120% of a vertical spacing between the first focal point F1 and the second focal point F2.

In one embodiment, the optical image sensor 450 is configured to simultaneously generate the first image and the second image from the redirected reflected radiation beam 414. In one embodiment, a location of a geometrical center of the first physical features 21 can be determined by analyzing the first image. A location of a geometrical center of the second physical features 22 can be determined by analyzing the second image. A lateral physical distance between the first physical features 21 and the second physical features 22 can be calculated.

In one embodiment, the first physical features are patterns of a first lithographic alignment mark 21 located at or about the first focal point F1, and the second physical features are patterns of a second lithographic alignment mark 22 located at or about the second focal point F2. In one embodiment, the method also includes changing a relative lateral position between the device under test 100 and the first and the second incident radiation beams (412A, 412B) by laterally moving the support 90 and/or the beams (412A, 412B).

The various embodiments of the present disclosure provide a high-throughput overlay measurement for alignment marks located at different vertical levels that cannot be in simultaneously focus by a single wavelength incident radiation beam, such as alignment marks that are vertically spaced by at least 1 micron, such as 1 to 10 microns. State-of-the-art overlay measurement tools typically spend about 0.55 second as a move-acquire-measure (MAM) time in order to change the depth of focus for focus depth differences greater than 0.5 microns. Actual image capture time is typically less than 0.25 second. The various embodiments of the present disclosure eliminates the time required to change the depth of focus for overlay measurement, and the a per-site measurement time may be less than 0.3 seconds. The apparatus and the methods of the present disclosure may at least double the throughput for overlay measurements for alignment marks that are vertically spaced by at least 0.5 microns, such as 1 to 2 microns.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. An optical alignment method, comprising:
providing an emitted radiation beam which includes a first peak wavelength and a second peak wavelength to a chromatic aberration enhancement component which increases a chromatic aberration of the emitted radiation beam between the first peak wavelength and the second peak wavelength by passing the emitted radiation beam through a glass having an index of refraction in a range from 1.8 to 2.0 at 656.3 nm wavelength;
providing a first incident radiation beam having the first peak wavelength and a second incident radiation beam having the second peak wavelength which is shorter than the first peak wavelength to respective first and second alignment marks located at different vertical levels in a device under test;
varying a distance between lenses within the chromatic aberration enhancement component to change a vertical spacing between a first focal point of the first incident radiation beam and a second focal point of the second incident radiation beam such that the vertical spacing matches a height difference between a top surface of the first alignment marks and a top surface of the second alignment marks;
detecting reflected radiation from the first and second alignment marks; and
using the detected reflected radiation for optical alignment of layers in the device under test.

2. The method claim 1, wherein the chromatic aberration enhancement component converts a first component of the emitted radiation beam having the first peak wavelength to the first incident radiation beam focused at the first focal point located at a first focal distance in the device under test, and converts a second component of the emitted radiation beam having the second peak wavelength to the second incident radiation beam focused at the second focal point located at second focal distance different from the first focal distance in the device under test.

3. The method claim 2, wherein the device under test comprises semiconductor device wafer including the first alignment mark located at a first level and the second alignment mark located at a second level that are vertically offset by a spacing in a range from 80% to 120% of a vertical spacing between the first focal point and the second focal point.

4. The method of claim 3, further comprising simultaneously generating a first image of the first alignment mark from a first component of the reflected radiation beam that has the first peak wavelength, and a second image of the second alignment mark from a second component of the reflected radiation beam that has the second peak wavelength.

5. The method of claim 4, wherein using the detected reflected radiation for optical alignment of layers comprises:
determining a location of a geometrical center of the first alignment mark by analyzing the first image;
determining a location of a geometrical center of the second alignment mark by analyzing the second image; and
calculating a lateral physical distance between the first alignment mark and the second alignment mark.

6. The method of claim 3, wherein:
the semiconductor device wafer comprises a plurality of three dimensional memory device die; and
the first alignment mark has a different shape from the second alignment mark.

7. The method of claim 1, further comprising changing a relative lateral position between the device under test and the first and the second incident radiation beams.

8. The method of claim 1, wherein the first peak wavelength is located red light range and the second peak wavelength is located in blue or ultraviolet light range.

9. The method of claim 1, wherein the first focal point and the second focal point are vertically offset by a vertical distance of at least one micron.

10. The method of claim 1, wherein the chromatic aberration enhancement component comprises at least one of a lens, prism or material which increases the chromatic aberration of the emitted radiation beam.

11. An optical measurement apparatus, comprising:
a radiation source configured to emit radiation at two or more peak wavelengths that include a first peak wavelength and a second peak wavelength;
a source-side optics system configured to guide an emitted radiation beam from the radiation source along an incident radiation path;
a support configured to support a device under test;
a chromatic aberration enhancement component located between the source-side optics system and the support, and configured to increase a chromatic aberration of the emitted radiation beam between the first peak wavelength and the second peak wavelength by passing the emitted radiation beam through a glass having an index of refraction in a range from 1.8 to 2.0 at 656.3 nm wavelength and to provide a first incident radiation beam having the first peak wavelength and a second incident radiation beam having the second peak wavelength which is shorter than the first peak wavelength toward the support, wherein the chromatic aberration enhance component is configured to vary a distance between lenses within the chromatic aberration enhancement component to change a vertical spacing between a first focal point of the first incident radiation beam and a second focal point of the second incident radiation beam such that the vertical spacing matches a height difference between a top surface of first alignment marks and a top surface of second alignment marks within the device under test; and
an optical detector.

12. The optical measurement apparatus of claim 11, wherein the chromatic aberration enhancement component is configured to convert a first component of the emitted radiation beam having the first peak wavelength to the first incident radiation beam focused at the first focal point located at a first focal distance, and to convert a second component of the emitted radiation beam having the second peak wavelength to the second incident radiation beam focused at the second focal point located at second focal distance different from the first focal distance.

13. The optical measurement apparatus of claim 12, wherein:
the support comprises a wafer chuck configured to hold the device under test which comprises a semiconductor device wafer such that the first focal point and the second focal point are located within a volume of the semiconductor device wafer; and
the optical detector comprises an optical image sensor configured to generate a first image from a first component of a reflected radiation beam that has the first wavelength, and to generate a second image from a second component of the reflected radiation beam that has the second wavelength.

14. The optical measurement apparatus of claim 13, further comprising a sensor-side optics system configured to direct the reflected radiation beam that is generated by reflection of an emitted radiation beam from the semiconductor device wafer to the optical detector.

15. The optical measurement apparatus of claim 13, wherein the optical image sensor is configured to simultaneously generate the first image and the second image.

16. The optical measurement apparatus of claim 15, further comprising a controller that is configured to automatically determine a location of a geometrical center of first geometrical features in focus that are captured in the first image and to automatically determine a geometrical center of second geometrical features in focus that are captured in the second image.

17. The optical measurement apparatus of claim 16, wherein the controller is configured to calculate a lateral physical distance between a first physical location in the semiconductor device wafer that corresponds to the geometrical center of the first geometrical features in the first image and a second physical location in the semiconductor device wafer that corresponds to the geometrical center of the second geometrical features in the second image.

18. The optical measurement apparatus of claim 12, wherein a ratio of the second peak wavelength to the first peak wavelength is in a range from 0.5 to 0.9.

19. The optical measurement apparatus of claim 18, wherein:
the radiation source comprises a hydrogen arc lamp; and
the first wavelength and the second wavelength are wavelengths within Balmer series spectral wavelengths.

20. The optical measurement apparatus of claim 12, wherein:
the first focal point and the second focal point are vertically offset by a vertical distance of at least one micron; and
the chromatic aberration enhancement component comprises at least one of a lens, prism or material which increases the chromatic aberration of the emitted radiation beam.

* * * * *